US010178782B2

(12) United States Patent
Gunes

(10) Patent No.: US 10,178,782 B2
(45) Date of Patent: Jan. 8, 2019

(54) MECHANICAL HOUSING AND CONNECTOR

(71) Applicant: AUTOLIV ASP, INC., Ogden, UT (US)

(72) Inventor: Melih Gunes, Wixom, MI (US)

(73) Assignee: VEONEER US, INC., Southfield, MI (US)

( * ) Notice: Subject to any disclaimer, the term of this patent is extended or adjusted under 35 U.S.C. 154(b) by 84 days.

(21) Appl. No.: 14/851,686

(22) Filed: Sep. 11, 2015

(65) Prior Publication Data

US 2017/0079154 A1 Mar. 16, 2017

(51) Int. Cl.
*H05K 5/06* (2006.01)
*H05K 5/00* (2006.01)

(52) U.S. Cl.
CPC .................. *H05K 5/0069* (2013.01)

(58) Field of Classification Search
CPC ..... H05K 5/069; H05K 5/0239; H05K 5/0217
USPC .......................................................... 361/728
See application file for complete search history.

(56) References Cited

U.S. PATENT DOCUMENTS

| 5,703,754 | A  | * | 12/1997 | Hinze   | B60R 16/0239 |
|           |    |   |         |         | 174/562 |
| 6,379,169 | B1 | * | 4/2002  | Corona  | H01R 13/5219 |
|           |    |   |         |         | 439/271 |
| 6,964,575 | B1 |   | 11/2005 | Sailor  | |
| 7,503,791 | B2 | * | 3/2009  | Fukaya  | H01R 13/5208 |
|           |    |   |         |         | 439/275 |
| 7,744,381 | B2 | * | 6/2010  | Honda   | H05K 5/0052 |
|           |    |   |         |         | 439/79 |
| 8,014,158 | B2 | * | 9/2011  | Kojima  | H05K 5/0052 |
|           |    |   |         |         | 174/50.5 |
| 2007/0072471 | A1 | * | 3/2007 | Miyakawa | H01R 43/005 |
|           |    |   |         |         | 439/274 |
| 2008/0045061 | A1 | * | 2/2008 | Hayashi | H01R 13/5202 |
|           |    |   |         |         | 439/246 |
| 2011/0256777 | A1 | * | 10/2011 | Schober | H05K 5/0039 |
|           |    |   |         |         | 439/660 |
| 2012/0045175 | A1 | * | 2/2012 | Ordo    | H01R 13/506 |
|           |    |   |         |         | 385/55 |
| 2012/0069532 | A1 | * | 3/2012 | Azumi   | H05K 5/0052 |
|           |    |   |         |         | 361/752 |
| 2013/0070432 | A1 |   | 3/2013 | Kawai et al. | |

(Continued)

OTHER PUBLICATIONS

International Search Report of PCT/US2016/050639, dated Nov. 17, 2016.

*Primary Examiner* — Tuan T Dinh
*Assistant Examiner* — Rockshana D Chowdhury
(74) *Attorney, Agent, or Firm* — Brinks Gilson & Lione

(57) ABSTRACT

An electronics module includes a housing, a connector, and a baseplate. The housing and connector are attached to each other and mounted to the baseplate. The housing includes a protrusion that is received between an inner flange and an outer flange of the connector. The housing and connector combine to define a sealing plane that extends to co-planar bottom surfaces of the housing and connector. The housing and connector, when assembled, define a water intrusion path between an outer protrusion of the housing and the outer flange of the connector. The water intrusion path includes a plurality of chicanes that reduces the pressure of water that enters the path. The bottom surface of the housing defines a recessed channel to receive water.

14 Claims, 15 Drawing Sheets

(56) References Cited

U.S. PATENT DOCUMENTS

2014/0085839 A1 3/2014 Nakano et al.
2015/0250072 A1* 9/2015 Ichikawa ............... H05K 5/063
                                                              439/587

* cited by examiner

MECHANICAL HOUSING AND CONNECTOR

FIELD OF THE INVENTION

This invention relates to a mechanical housings and, more particularly, to housings for electrical modules and connectors used in motor vehicles.

BACKGROUND OF THE INVENTION

Electrical connections are in widespread use in motor vehicles. Motor vehicles include various electrical components for managing the control and operation of myriad vehicle systems. For example, anti-lock brake systems, electronic stability control, adaptive cruise control, blind spot detection, lane departure warning systems, vehicle navigation systems, entertainment systems, automatic transmission systems, vehicle monitoring systems, and the like are various components that are operated electrically as part of the overall motor vehicle.

The various electrical components can be integrated into larger overall modules including more than one system and/or they can be separate modular components. In any event, the electrical modules are typically connected to a power source as well as a control unit or controller that sends and receives data to and from the module. Accordingly, the modules include electrical connectors for connecting to the controller and power source or a wire harness that is ultimately connected to the power source and controller.

The various electrical component modules are disposed at different vehicle locations depending on their function. In many cases, the modules are located under the vehicle hood or at other locations of the vehicle that can become exposed to water or other fluid during typical driving situations. Accordingly, the modules are assembled to limit the introduction of water and contaminant inside the module.

Additionally, the connection between the module and the wire harness is also exposed to water or other fluid during typical operation. Thus, the connection between the connector and the module is also desired to be resistant to the introduction of water and contaminant.

There are various types of electrical connections and connectors used in different vehicle designs. Thus, a connection portion of the module that connects to the wire harness can be different even for the same module. Accordingly, the connector portion and module housing can be separate components that are attached to complete the assembly of the module. The attachment between the connection portion and the housing results in a seam therebetween, and this seam is susceptible to the introduction of water and contaminant.

Assembled modules generally undergo testing during manufacturing to determine whether the connection portion and the housing are properly sealed. This testing can take the form of a high pressure spray testing to determine whether a leak will occur.

One solution to potential leaks in the assembled module is to apply a silicone sealant bead or other type of sealing material from the outside of the module along the areas of the leak path between the connector portion and the housing portion. However, this adds a labor intensive and costly step to assembling the connector and housing.

In addition to the interface between the connector portion and the housing, the connector portion and the housing are also typically mounted to a baseplate. The mounting is generally accomplished by inserting screws through the baseplate that are received by the housing. This creates a compressive force between the housing and the baseplate and the connector and the baseplate. The compression of the housing onto the baseplate, however, is limited by what the screws can provide. And the resulting compression between the components may be insufficient to prevent leaks or hold up to the required spray testing.

One solution to this leak path includes the use of an applied silicone, but this adds an additional step after assembly, and makes disassembly and re-assembly, if necessary, more costly and time consuming.

Accordingly, improvements can be made in assembling the housing, connector, and baseplate in a manner that is both cost and size efficient while being resistant to leaks from spray testing.

SUMMARY

An electronics module is provided that includes a baseplate having an upper surface and a lower surface and a mounting ring extending upwardly from the upper surface; a housing coupled to the mounting ring of the baseplate, the housing defining a bottom surface and a bottom opening and a side opening; and a connector attached to the housing at the side opening of the housing, the connector defining a bottom portion and an upper mating portion. The upper mating portion couples with the housing along the side opening. The bottom surface of the housing and the bottom surface of the connector face the upper surface of the baseplate. The housing defines an inner protrusion having an outer surface extending upwardly from the bottom surface. The connector defines an outer flange having an inner surface extending upwardly from the bottom surface. The inner surface and the outer surface are in contact substantially around a perimeter of the inner protrusion and outer flange to define a sealing plane that extends to the bottom surfaces of the inner protrusion and outer flange.

The housing and connector combine to define a water intrusion path that includes a plurality of chicanes or a labyrinth for reducing water pressure that enters the water intrusion path.

The housing may further include at least one recessed channel defined by the bottom surface of the housing extending into the bottom surface and defining at least an inner portion of the bottom surface and an outer portion of the bottom surface.

In another approach, an assembly for use with an electronics module is provided. The assembly includes: a housing defining a bottom surface and a bottom opening and a side opening; and a connector attached to the housing at the side opening of the housing, the connector defining a bottom portion and an upper mating portion. The upper mating portion couples with the housing along the side opening. The housing defines an inner protrusion having an outer surface extending upwardly from the bottom surface. The connector defines an outer flange having an inner surface extending upwardly from the bottom surface. The inner surface and the outer surface are in contact substantially around a perimeter of the inner protrusion and outer flange to define a sealing plane that extends to the bottom surfaces of the inner protrusion and outer flange.

In another approach, assembly for being mounted to a baseplate is provided. The assembly includes: a housing for being mounted to the baseplate, the housing defining a bottom surface and a bottom opening and a side opening, the housing attached to a raised mounting portion of the baseplate; and a connector attached to the housing at the side opening of the housing, the connector defining a bottom surface and an upper mating portion, wherein the upper mating portion couples with the housing along the side opening. The bottom surface of the housing and the bottom surface of the connector are co-planar. The bottom surfaces of the housing and connector contact each other to define a continuous bottom surface. The housing defines at least one channel extending along the bottom surface thereof. The bottom surface of the housing includes an inner bottom surface and an outer bottom surface, and the channel is disposed between the inner bottom surface and the outer bottom surface. The connector bottom surface and the inner bottom surface of the housing combine at a pair of interfaces between the bottom surfaces of the housing and the connector to define a continuous combined bottom surface.

Additional benefits and advantages of the present invention will become apparent to those skilled in the art to which the present invention relates from the subsequent description of the preferred embodiment and the appended claims, taken in conjunction with the accompanying drawings.

DETAILED DESCRIPTION OF THE INVENTION

An electrical component module 10 in accordance with various embodiments of this invention is illustrated in FIGS. 1A-14. The module 10 performs control functions for a motor vehicle or other vehicle or device for which a module can perform various communication functions with other components of the vehicle.

Figure 1A:
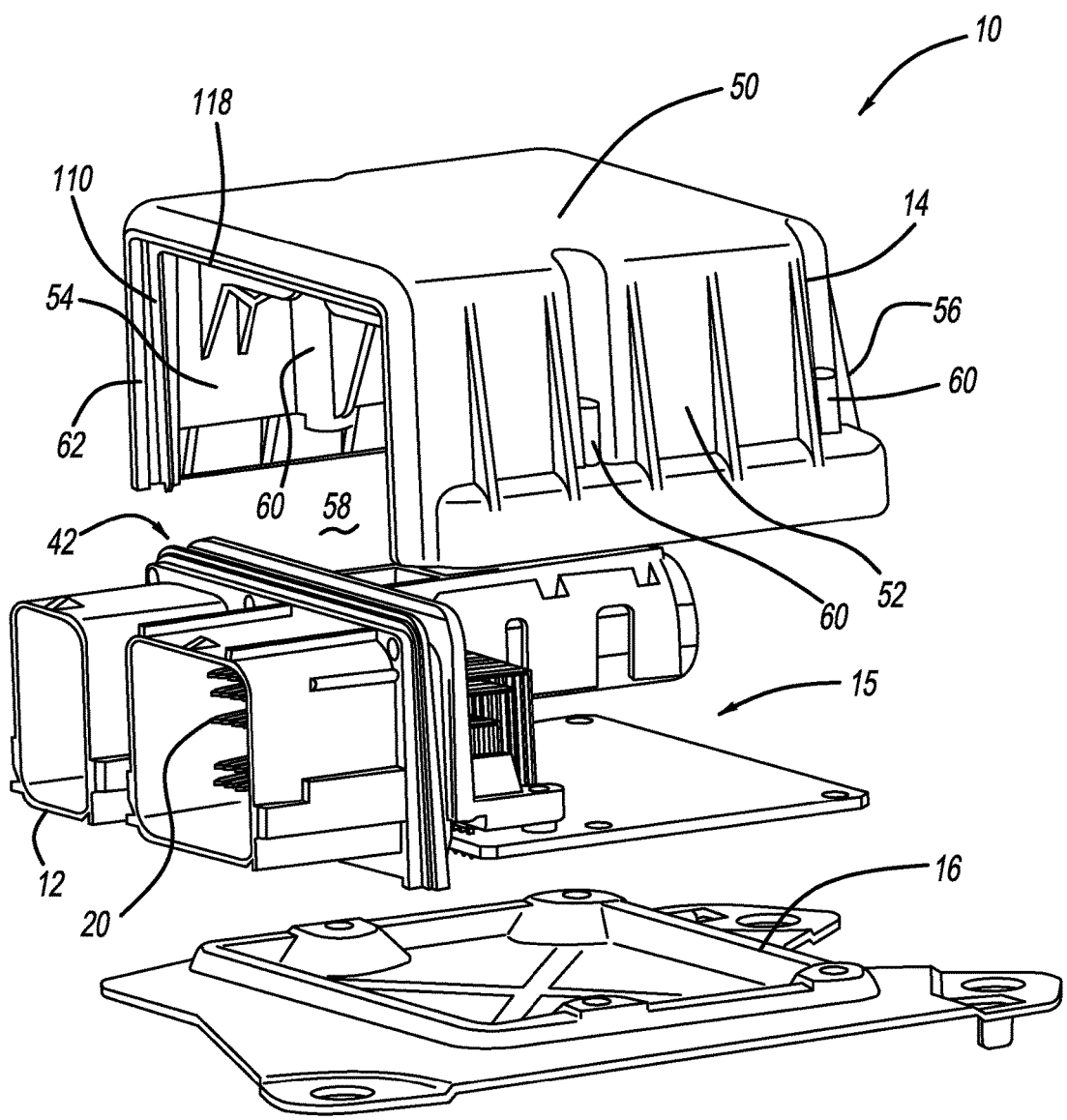
FIG. 1A-1B is an exploded view of a module including a housing, connector, and baseplate.
Figure 1B:
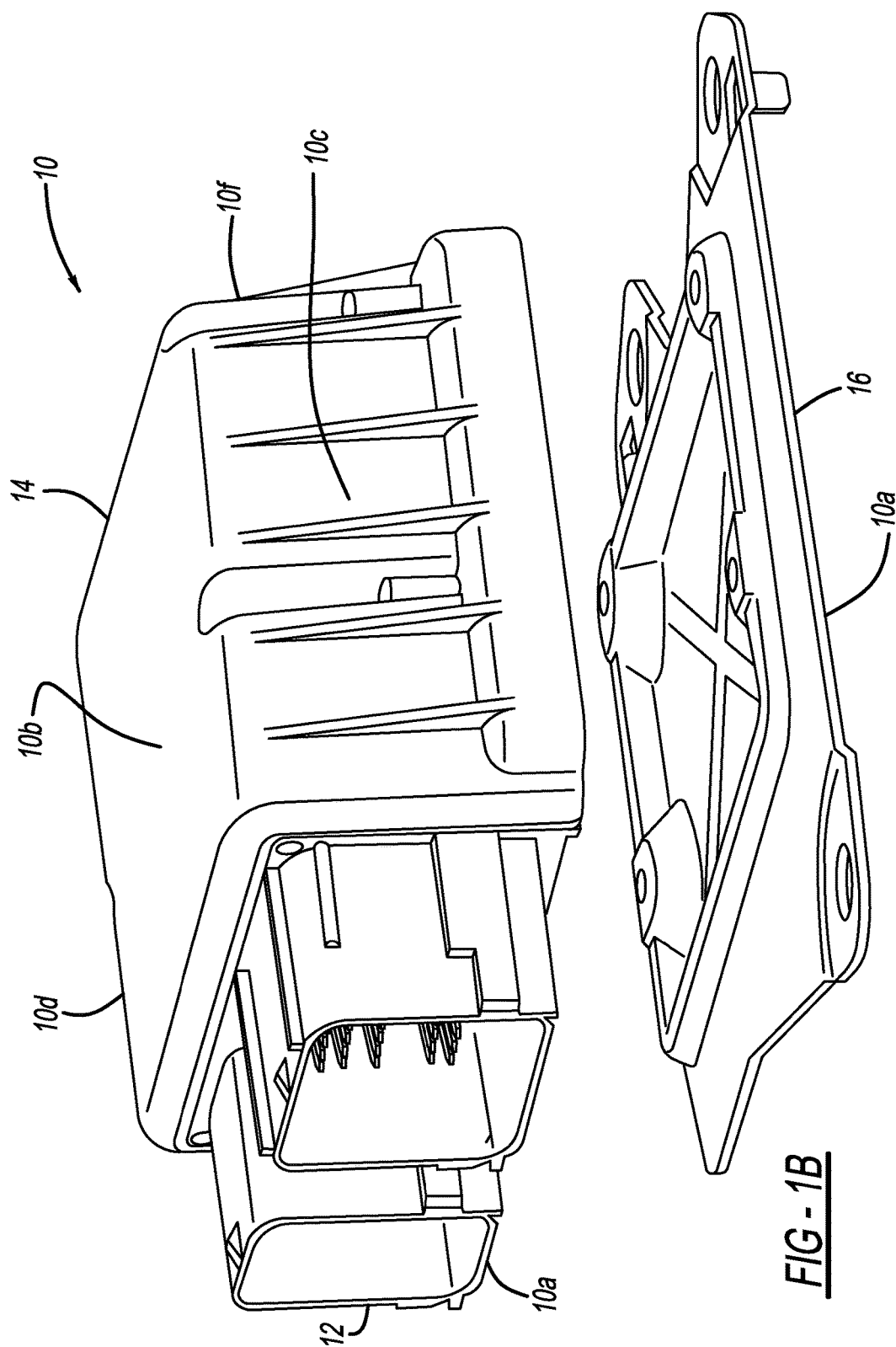

With reference to FIG. 1, the module 10 includes an electrical connector 12, a housing 14, and a baseplate 16. The module 10 further includes a plurality of electrical components 15 that are disposed and retained within the housing 14. In one approach, a printed circuit board ("PCB") 17 is attached to the connector 12 and mounted to the baseplate 16 between the baseplate 16 and the housing 14. The electrical components can also include additional circuit boards, wires, computer readable storage medium, a processor, a computing device, and the like. The components combine to have one or more inputs and outputs that communicate with other modules and/or a controller of the vehicle or device with which the module 10 is associated.

The inputs and outputs are arranged to connect with the connector 12 in order to communicate with other modules and/or controllers of the vehicle. The connector 12 is operatively connected to these other modules via a wire harness (not shown) that extends from the module 10 to the other modules, controllers, or communication hubs associated with the vehicle. The wire harness includes various known wire types (analog, digital, fiberoptic, or the like) for communicating between the module 10 and other components of the vehicle. Additionally, the wire harness includes a power connection, in some instances, for providing power to the module from a power source of the vehicle, such as a vehicle battery or other power storage device. It will be appreciated that other known wired communication and power connections could also be part of the wire harness. The wire harness is releasably attachable to the connector 12 to supply power and communication in a manner known in the art.

The connector 12 includes a plurality of pins 20 that are arranged to mate with the wire harness to operatively connect the components of the module 10 to other vehicle modules via the wire harness. The pins 20 can be in the form of a "male" pin that will mate with a "female" receptacle disposed on the wire harness or, alternatively, the pins 20 can be in the form of a "female" receptacle that will mate with "male" pins of the wire harness. Other mating connections types could also be used for the pins 20. Accordingly, reference to the pins 20 refers to any of these known mating connection types, male, female, or otherwise.

The connector 12 is sized and arranged to connect with the housing 14 to ultimately create an enclosed space in which to house the internal components 15 of the module 10 when the connector 12 and housing 14 are mounted to the baseplate 16. When the connector 12, the housing 14, and baseplate 16 are assembled, the module 10 is generally in the form of a closed box having a bottom side 10a, top side 10b, front side 10c, rear side 10d, left side 10e, and right side 10f. These bottom, top, front, rear, left and right designations are for reference to each other. It will be appreciated that these designations do not limit the design to any particular installed orientation. It will also be appreciated that the module 10 could have other general enclosed shapes, such as other boxes with a top, bottom, and multiple sides, or a dome shape, cylindrical can shape, or the like. However, for purposes of discussion, the above described box shape will be described.

In one approach, the connector 12 is connected to the housing 14 at the left side of the module 10. The connector 12 and housing 14 each include cooperating flanges and surfaces, further described below, that allow the connector 12 and housing 14 to mate while limiting a leak path therebetween.

Figure 2:
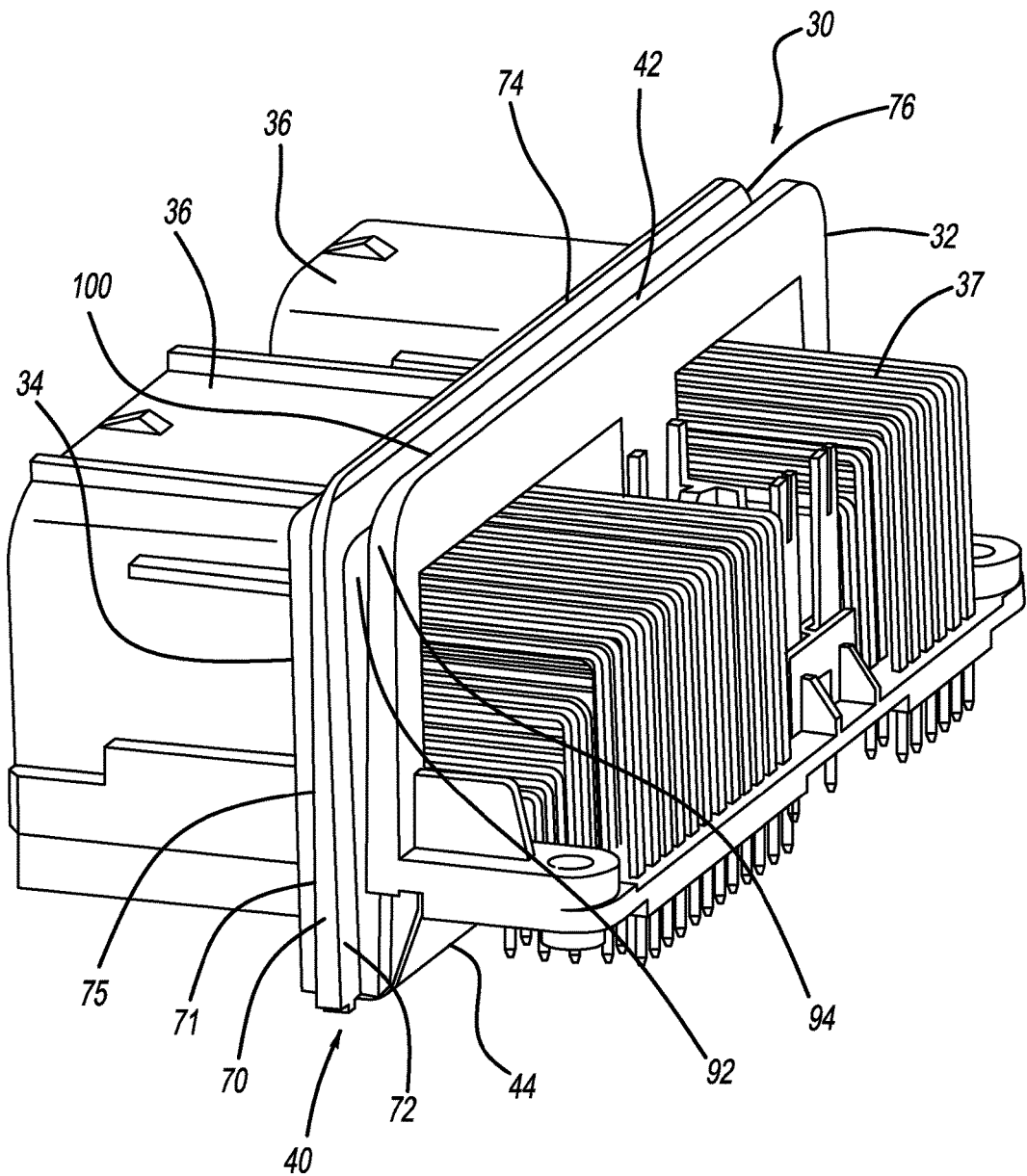
FIG. 2 is an isometric view of the connector illustrating a plurality of flanges for mating with the housing.

With reference to FIG. 2, the connector 12 includes a sidewall 30 that, when mated with the housing 14, closes off the left side of the module. The sidewall 30 has an inner surface 32 and an outer surface 34. The inner surface 32 faces the interior of the module when the connector 12 is mated with the housing 14. The outer surface 34 faces outward from the module 10 when the connector 12 is mated with the housing 14.

The connector 12 may include one or more ports 36 extending outwardly and generally perpendicularly from the outer surface 34 of the sidewall 30. The ports 36 are shaped to correspond to a predetermined size such that it will matingly connect with a connection portion of the wire harness. The pins 20 are disposed within the ports 36 to protect the pins 20 from damage due to unintended contact. Thus, the ports 36 provide a secure connection point to the wire harness 18, as well as providing protection for the pins 20.

One or more of the internal components of the module 10 extend inwardly from or are mounted directly or indirectly to the inner surface 32 of the sidewall 30, such that when the connector 12 and housing 14 are combined, the internal components are surrounded and housed by the connector 12 and housing 14. Wires or leads 37 of the internal components may extend through the sidewall 30 from the inner surface 32 to the outer surface 34, where the wires or leads 37 terminate at the pins 20. Accordingly, the internal components can connect to the wire harness.

The connector 12 couples to the housing 14 along a peripheral edge portion 40. The peripheral edge portion 40 extends along four sides of the sidewall 30. The peripheral edge portion 40 includes an upper mating portion 42 that extends along the front, rear, and top sides of the sidewall 30. The upper mating portion 42 couples with the housing 14. The peripheral edge portion 40 also includes a lower mating portion 44, which extends along the bottom side of the sidewall 30.

The upper mating portion 42 includes multiple protrusions and flanges that cooperate to similar structure of the housing 14 to define a seal between the connector 12 and housing 14. The cooperating structure of the connector 12 and housing 14 will be described in further detail below.

Turning now to the housing 14, as shown in FIG. 1, the housing 14 has a generally box-type shape with multiple sidewalls: an upper sidewall 50, a front sidewall 52, a rear sidewall 54, and a right sidewall 56. The housing 14 is generally open on the bottom and the left side. The connector 12 couples with the left side of the housing 14, and the baseplate 16 couples with the bottom of the housing 14 to enclose the module 10 on all sides. The housing 14 defines an interior 58 within the sidewalls 50, 52, 54, and 56. The internal components of the module are disposed within this interior space when the module 10 is assembled.

The housing 14 further includes a plurality of posts 60 disposed within the interior 58 of the housing for receiving a fastener. These posts 60 are preferably integrally formed with the one or more of the sidewalls of the housing 14. For example, in one approach, there are four posts 60, one of the posts 60 is integrally formed with the rear sidewall 54, another of the posts 60 is integrally formed with the front sidewall 52, another is integrally formed at the intersection of the rear sidewall 54 and right sidewall 56, and another is integrally formed at the intersection of the front sidewall 52 and right sidewall 56. Of course, other arrangements of the posts 60 could also be used.

The layout of the posts 60 corresponds to cooperating structure of the baseplate 16, as further described below. The layout of the posts 60 can also correspond to a mounting pattern of one or more of the internal components of the module 10, such that the one or more internal component can be retained by the posts 60 when the module 10 is assembled.

As referenced above, the connector 12 includes the upper mating portion 42 that couples with the housing 14 at the interface therebetween. Accordingly, the housing 14 includes a side mating portion 62 that cooperates with the upper mating portion 42 of the connector 12 to couple the connector 12 and housing 14 together.

The side mating portion 62 defines an opening or window 64 on the left side of the housing 14, and the connector 12, when coupled with the housing 14, closes off the window 64. The side mating portion 62 extends continuously along the left peripheral edges of the rear sidewall 54, the upper sidewall 50, and front sidewall 52.

Having described the overall structure of the connector 12 and the housing 14, the cooperating structure of the upper mating portion 42 of the connector 12 and the side mating portion 62 of the housing will now be described in further detail.

Figure 3:
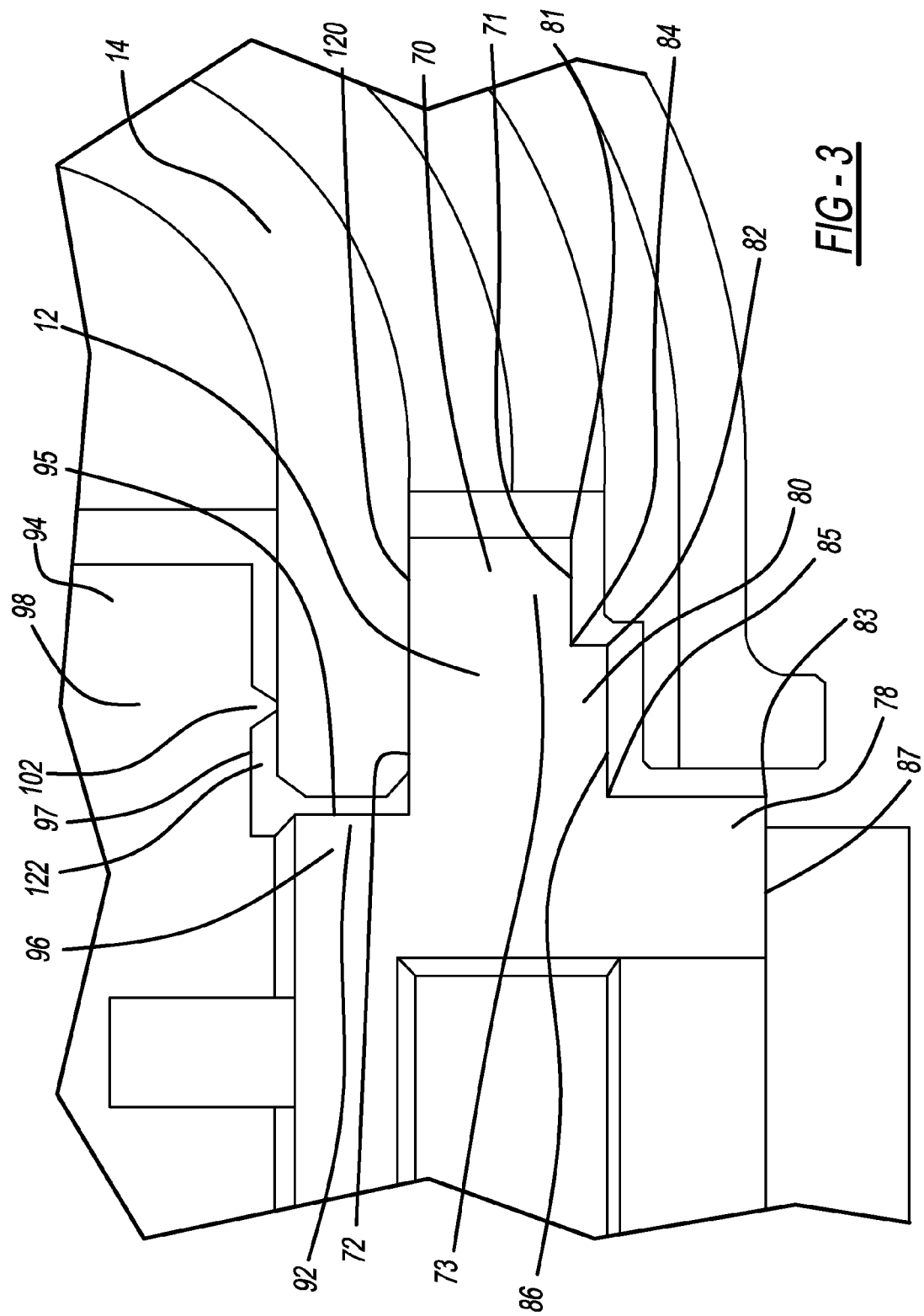
FIG. 3 is a partial bottom view of the connector and housing in an assembled state, illustrating the flanges of the connector and protrusions of the housing.

With reference to FIGS. 2 and 3, as described above, the connector 12 includes the upper mating portion 42 that extends along the front, top, and rear sides of the sidewall 30 of the connector. More particularly, the sidewall 30 and upper mating portion 42 thereof includes multiple flanges and protrusions extending along the upper mating portion 42.

The connector 12 includes a first or outer flange 70 that extends around the peripheral edge of the sidewall 30. The outer flange 70 includes a first or outer surface 71 and a second or inner surface 72. With the outer flange 70 extending around the sidewall 30, the outer flange 70 therefore includes a bottom edge 73, a top edge 74, a front edge 75, and a rear edge 76.

As shown in FIG. 3, the outer flange 70 further includes an outer stepped portion 78 that extends outwardly from the outer surface 71. The outer stepped portion 78 extends upwardly from the bottom edge 73 toward the top edge 74, at both the front and rear of the connector 12, and also extends horizontally from front to rear of the connector 12 along the top of the connector 12. The outer profile of the outer stepped portion 78 thereby defines an inverted U-shape that is stepped inwardly from the outer profile of the outer flange 70.

The connector 12 further includes an intermediate stepped portion 80 that extends along the intersection of the outer flange 70 and the outer stepped portion 78. The intermediate stepped portion 80 has an inverted U-shape, similar to the inverted U-shape of the outer stepped portion 78. Accordingly, because the intermediate stepped portion 80 extends along the intersection of the outer flange 70 and the outer stepped portion 78, the outer profile of the intermediate stepped portion 80 is slightly larger than the outer profile of the outer stepped portion 78, while being slightly smaller than the outer profile of the outer flange 70. Put another way, the intermediate stepped portion 80 is between the outer stepped portion 78 and the outer flange 70.

The combination of the outer flange 70, intermediate stepped portion 80, and outer stepped portion 78 defines a plurality of outer and inner corners. The outer flange defines a first outer corner 81, the intermediate stepped portion defines a second outer corner 82, and the outer stepped portion defines a third outer corner 83. A first inner corner 84 is defined at the intersection of the outer flange 70 and the intermediate stepped portion 80, and a second inner corner 85 is defined at the intersection of the intermediate stepped portion 80 and the outer stepped portion 78. The combination of the inner corners 84 and 85, along with the outer corners 81 and 82 cooperate with similar structure of the housing 14, further described below, to define a plurality of chicanes, further described below.

The outer surface 71 of the outer flange 70 is generally planar or flat and has a generally inverted U-shaped surface area facing outwardly away from the interior of the module 10 when assembled. The intermediate stepped portion 80 also defines an outer surface 86 having an inverted U-shape and is disposed outwardly of the outer surface 71 of the outer flange 70. The flange 70 also defines an outer surface 87 of the outer stepped portion 78 with an inverted U-shape that is disposed outwardly of the outer surface 86 of the intermediate stepped portion 80. The outer surfaces 86 and 87 are generally parallel to the outer surface 71. Thus, the outer flange 70 effectively includes three planar outer surfaces that are parallel and offset from each other: the outer surface 71, the outer surface 86 of the intermediate stepped portion 80, and the outer surface 87 of the outer stepped portion 78.

Figure 4:
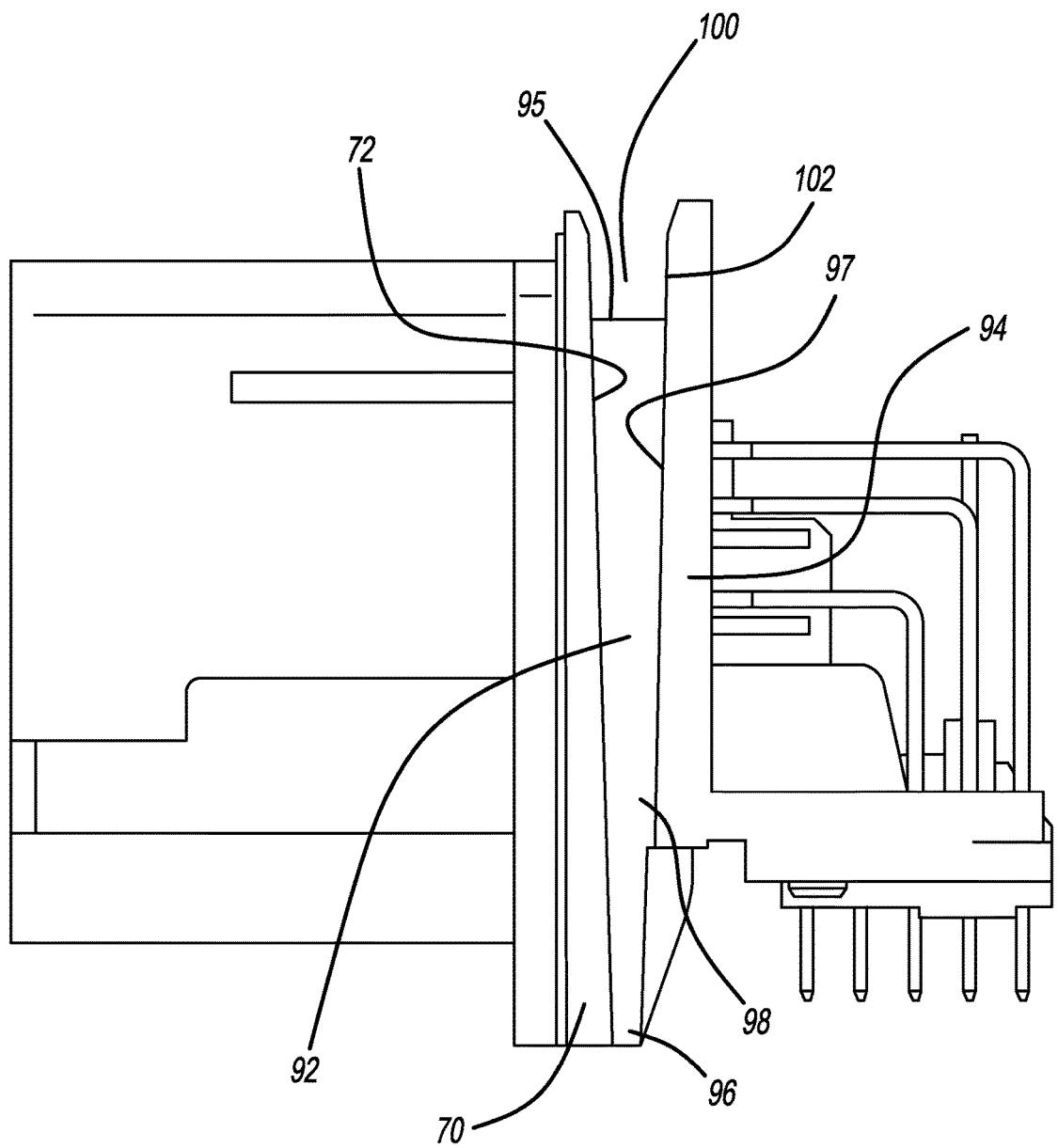
FIG. 4 is a side view of the connector illustrating a channel defined between an inner flange and an outer flange of the connector.

Turning now to FIGS. 2 and 4, the outer flange 70 defines the inner surface 72 that has an inverted U-shape facing inwardly toward the housing 14 when the connector 12 and housing 14 are assembled. The inner surface 72 is generally planar or flat. In a preferred form, the inner surface 72 consists of a single planar surface with a constant slope.

The inner surface 72 is arranged at an acute angle relative to the outer surface 71, such that the outer flange 70 has a generally wedged or tapered shape. The tapering is such that the outer flange 70 is thinner at the top than at the bottom.

The sidewall 30 of the connector also includes a recessed body portion 92 and an inner flange 94. The recessed body portion 92 is disposed between the outer flange 70 and the inner flange 94 and defines a U-shaped outer surface 95 that faces upward, forward, and rearward. The recessed body portion 92 also includes a bottom surface 96. The outer surface 95 of the recessed body portion extends generally perpendicularly relative to the outer surface 71 of the outer flange.

The inner flange 94 extends upwardly and outwardly from the recessed body portion 92 in a manner similar to the outer flange 70. Accordingly, the inner flange 94 defines an outer surface 97 that faces the inner surface 72 of the outer flange 70. The inner flange 94 also includes a bottom surface 98 that is disposed above the bottom surface 96 of the body portion 92. The outer surface 97 of the inner flange 94 has an inverted U-shape, terminating at the bottom surface 98.

The outer surface 97 of the inner flange 94 is generally planar of flat and arranged at an acute angle relative to the inner surface 72 of the outer flange 70. The space between the outer flange 70 and inner flange 74 decreases from top to bottom. Because both surfaces 97 and 72 are generally planar, the space between the flanges 70 and 94 decreases at a generally constant rate.

Accordingly, the inner flange 94, recessed body portion 92, and outer flange 70 combine to define a channel 100 having a generally inverted U-shape. The width of the channel 100 is greater at the top than the bottom.

Figure 5:
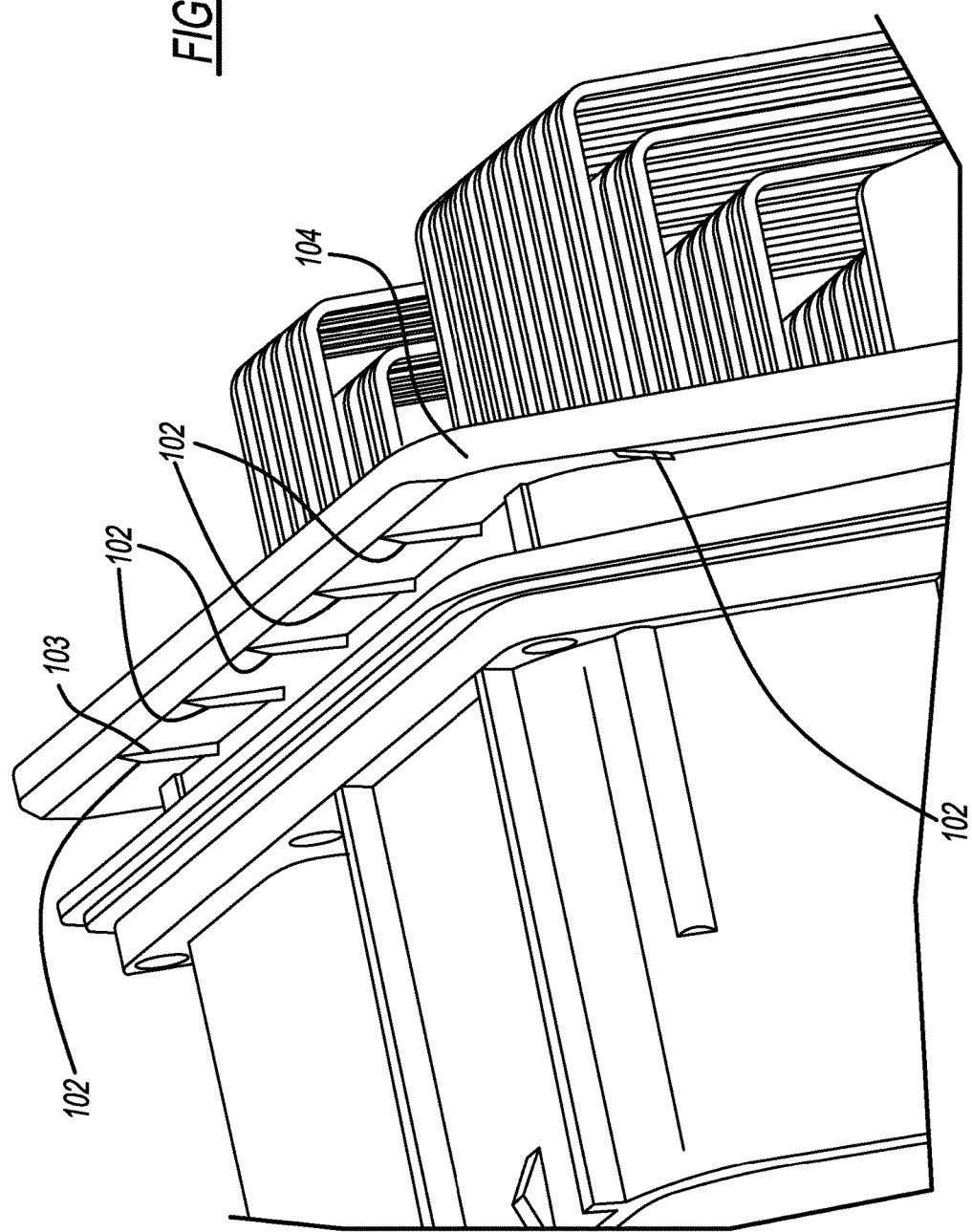
FIG. 5 is an isometric view illustrating a plurality of crush ribs disposed on the inner flange of the connector and extending into the channel.

As shown in FIG. 5, the inner flange 94 also include a plurality of crush ribs 102 extending generally vertically along the outer surface 97 of the inner flange 94. The plurality of crush ribs 102 include upper crush ribs 103 and side crush ribs 104. The upper crush ribs 103 are disposed above the recessed body portion 92. The side crush ribs 104 are disposed at both the front side and the rear side of the recessed body portion 92.

The plurality of crush ribs 102 aid in the coupling of the housing 14 to the connector 12 when the housing 14 and connector 12 are assembled. More particularly, the crush ribs 102 force the housing 14 against the inner surface 72 of the outer flange 70, thereby sealing the interface between the housing 14 and connector 12 that occurs along the inner surface 72 of the outer flange 70.

Turning once again to the housing 14, the housing 14 includes the side mating portion 62 that cooperates with the upper mating portion 42 of the connector 12, which was described in detail above and shown in FIG. 1.

Figure 6:
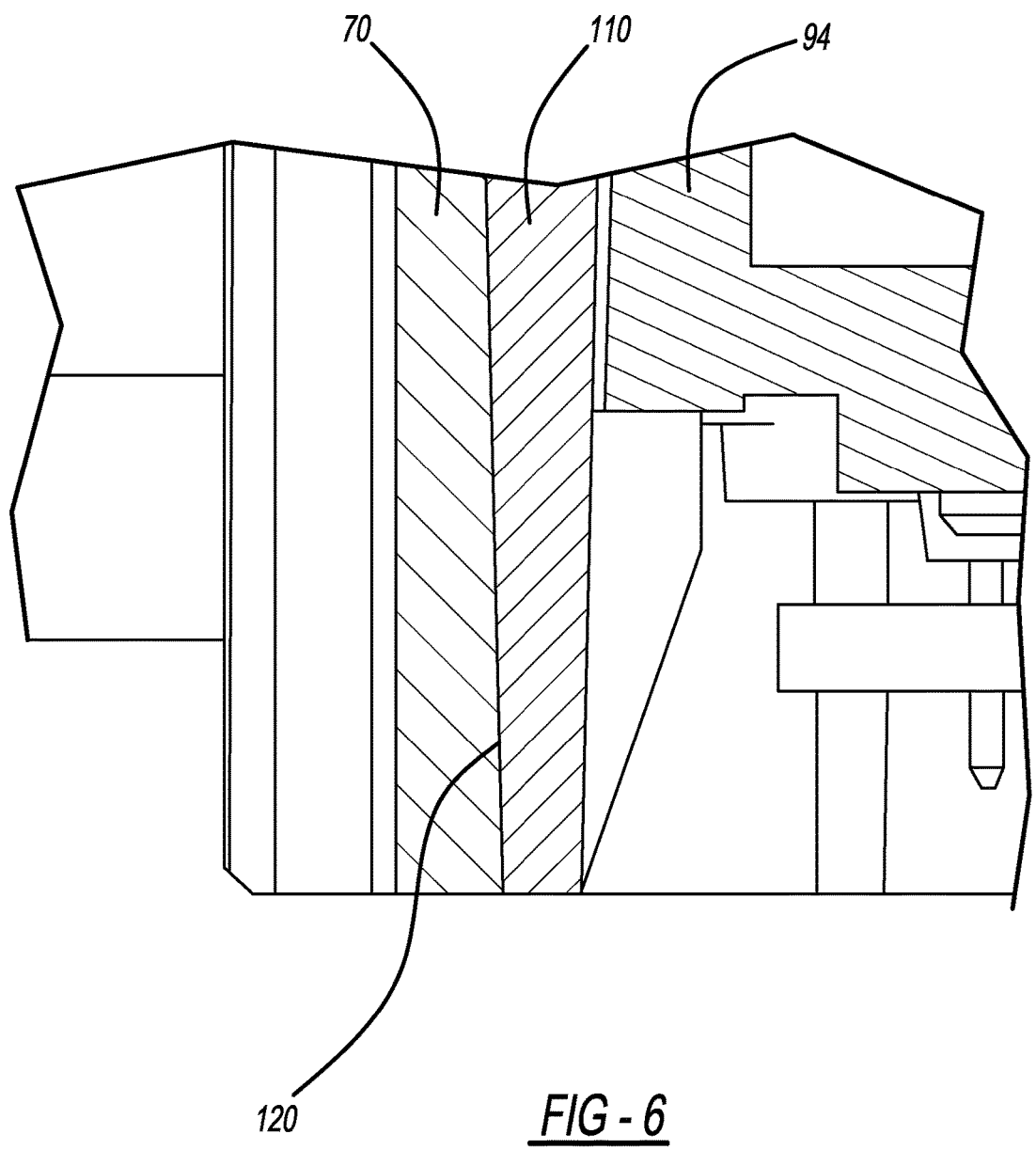
FIG. 6 is side cross-sectional view of the connector and housing in an assembled state and illustrating a sealing plane defined between the connector and the housing.
Figure 7:
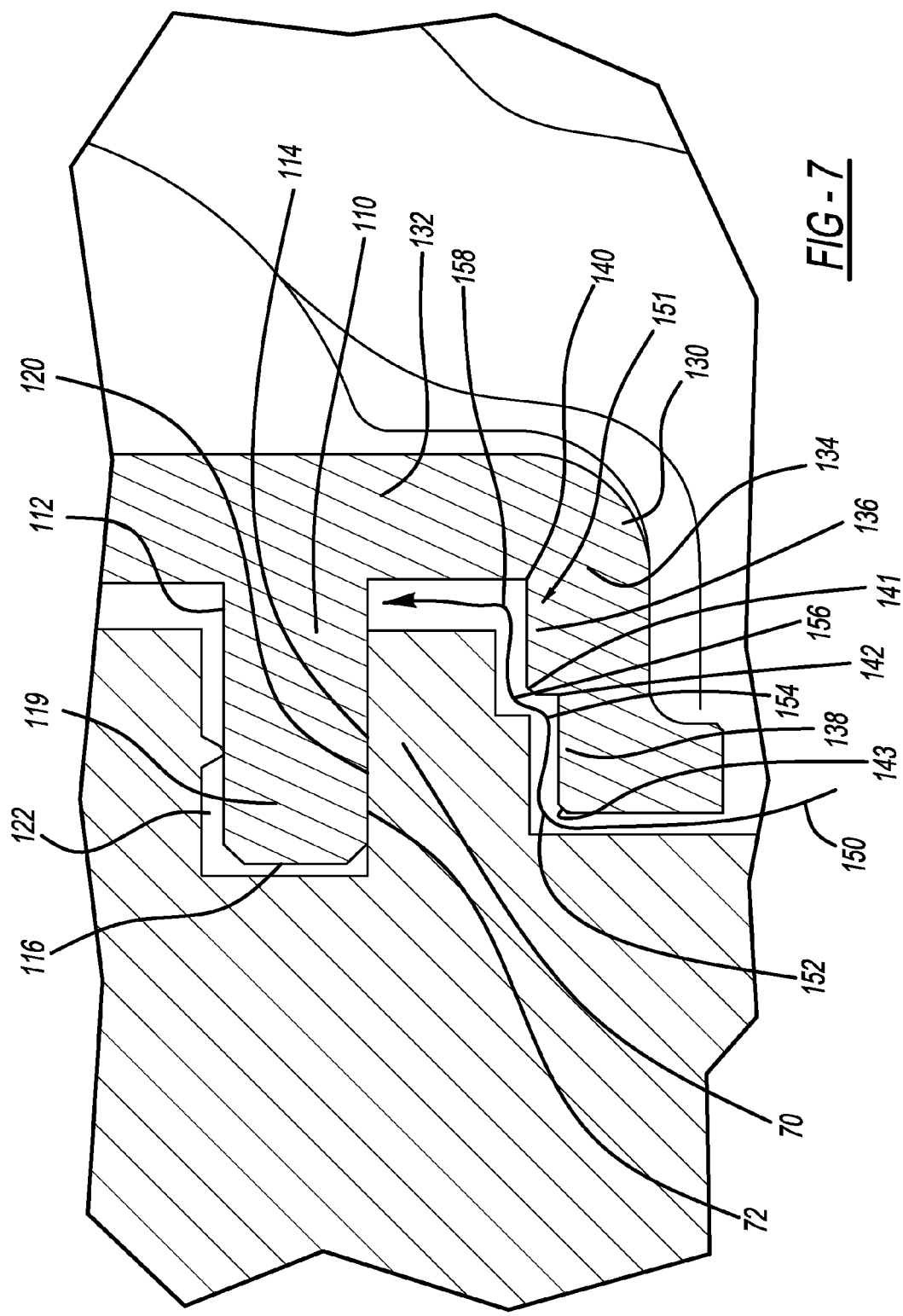
FIG. 7 is a cross-sectional view of the connector and housing in an assembled state illustrating a water intrusion path and a plurality of chicanes defined by the connector and housing that reduces water pressure within the water intrusion path.

With reference now to FIGS. 6-7, the side mating portion 62 includes multiple protruding structures that cooperate with the inner flange 94 and outer flange 70 of the connector 12, and the channel 100 defined by the flanges of the connector 12. More particularly, the side mating portion 62 of the housing 14 includes an inner flange or protrusion 110. The inner protrusion 110 extends inwardly from the rear sidewall 54, upper sidewall 50, and front sidewall 52. The inner protrusion 110 has a generally tapered shape and is arranged to be inserted into the channel 100 defined by the connector 12. Accordingly, the inner protrusion 110 has a shape corresponding to the tapered shape of the channel 100 defined by the connector 12. The inner protrusion 110 has an inverted U-shaped profile. The inner protrusion 110 can also have a non-tapering shape in an alternative approach, or it can have a taper that is less than the taper of the channel 100, so long as the protrusion 110 can fit within the channel when inserted. As shown in FIG. 6, the inner protrusion 110 is shown inserted between the outer flange 70 and the inner flange 94 of the connector 12.

The inner protrusion 110 includes an inner surface 112, an outer surface 114, and an intermediate surface 116. The inner surface 112 faces away from the outer flange 70 of the connector 12 and is generally planar. The outer surface 114 faces the outer flange 70 of the connector 12 and is generally planar. The intermediate surface 116 faces rearward, downward, and forward, and extends between the inner surface 112 and outer surface 114. Accordingly, the intermediate surface defines 116 a window 118 having a height (from top to bottom) and a width (from back to front). The width of the window 118 is slightly greater than the width of the recessed body portion 92 of the connector 12. Accordingly, the recessed body portion 92 of the connector 12 is received within the window 118 when the connector 12 and housing 14 are assembled, while allowing for a small internal gap (front to back) between the recessed body portion 92 and the inner protrusion 110.

The inner protrusion 110 also includes a bottom surface 119. The height of the window 118 extends from the bottom surface 119 of the inner protrusion 110 to the top portion of the intermediate surface 116. The height of the window 118 generally corresponds to the height of the recessed body 92 of the connector 12, as measured from the bottom surface 73 of the outer flange 70 to the top surface of the recessed inner body 92. The generally corresponding heights allows the top portion of the intermediate surface 116 to act as a stop against the insertion of the connector 12, and results in the bottom surface 119 of the inner protrusion 110 being generally co-planar with the bottom surface 73 of the outer flange 70 of the connector 12.

The outer surface 114 of the inner protrusion 110 generally corresponds to the inner surface 72 of the outer flange 70. The corresponding shapes of the outer surface 114 of the inner protrusion 110 and the inner surface 72 of the outer flange 70 defines a sealing plane 120 between the connector 12 and the housing 14. The sealing plane 120 extends to the bottom of both the outer flange 70 and the inner protrusion 110 and across the top of outer flange 70 and inner protrusion 70. Accordingly, water or sprayed water from testing that contacts the area of the module 10 along the upper mating portion 42 of the connector 12 and the mating portion 62 of the housing 14 will be blocked by the sealing plane 120 without the use of a gasket or similar material between the connector 12 and housing 14, and without the use of a post-assembly applied sealing agent, such as silicone or the like.

The inner surface 112 of the inner protrusion 110 faces the outer surface 97 of the inner flange 94 of the connector 12. When the connector 12 and housing 14 are assembled, the crush ribs 102 of the connector 12 force the inner protrusion 110 against the outer flange 70 and generally away from the inner flange 94 to define the sealing plane 120. Accordingly, a gap 122 is defined between the inner protrusion 110 and the inner flange 94 when the connector 12 and housing 14 are connected.

The bottom of the inner protrusion 110 of the housing 14 extends below the bottom of the inner flange 94 of the connector 12. However, with the interface between the inner protrusion 110 and the inner flange 94 being inside the assembly relative to the sealing plane 120, the lack of complete contact between the inner protrusion 110 and the inner flange 94 does not affect the sealing of the module 10. Indeed, as mentioned above, the inner flange 94 and the inner protrusion 110 define the gap 122, so this interface is not a sealing interface.

The housing 14 further includes an outer protrusion 130 that is disposed on the opposite side of the outer flange 70 relative to the inner protrusion 110 when the connector 12 and housing 14 are assembled. Accordingly, the outer flange 70 is disposed between the outer protrusion 130 and the inner protrusion 110. The outer protrusion 130 and inner protrusion 110 are connected by a connecting wall portion 132.

The outer protrusion 130 and connection wall portion 132 define a bottom surface 134 that is generally co-planar with the bottom surface 119 of the inner protrusion 110, thereby defining a continuously flat surface. The outer protrusion 130 and wall portion 132 extend upwardly from the bottom surface 134 at both the front and rear sides of the housing, and also extend across the top of the housing 14, such that the outer flange 70 of the connector 12 is substantially covered by the outer protrusion 130 along the front, top, and rear sides of the upper mating portion 42.

The outer protrusion 130 includes a first stepped portion 136 and a second stepped portion 138 that defines a stepped inner profile that, when combined with the connecting wall 132, define multiple inner and outer corners. A first inner corner 140 is defined at the intersection of the connecting wall 132 and the first stepped portion 136. A first outer corner 141 is defined by the first stepped portion 136. A second inner corner 142 is defined at the intersection of the first stepped portion 136 and the second stepped portion 138. A second outer corner 143 is defined by the second stepped portion 138.

The surfaces and corners of the outer protrusion 130 are arranged to correspond to the surfaces and corners of the outer flange 70 of the connector 12. The surfaces and corners of the outer protrusion 130 are offset from the corresponding surfaces and corners of the outer flange 70. This offset arrangement defines a water intrusion path 150 that includes multiple chicanes arranged to create a tortuous path for water that contacts the module 10 in that area.

The intrusion path 150 includes a plurality of chicanes 151 including a first chicane 152, or approximately 90 degree bend, at the entry point of water traveling toward the path. The path 150 further follows with a second chicane 154, which makes another 90 degree bend. The path follows with a third chicane 156, which is a further 90 degree bend. The path again follows with a fourth chicane 158, which is another 90 degree bend. The bends are approximately 90 degrees back and forth, in a zig-zag manner. The path 150 terminates at the intersection of the connecting wall 132 and the inner protrusion 110, which is adjacent the sealing plane 120. The water intrusion path 150 extends upwardly at both the front and rear sides of the module 10, as well as across the top of the interface between the connector 12 and housing 14.

Water, therefore, may be permitted to travel between the outer protrusion 110 of the housing 14 and the outer flange 70 of the connector 12, where the water will enter through the water intrusion path 150, and will continue past the chicanes 151, making 90 degree bends at each of the chicanes 151. Each time the water is forced around a corner at one of the chicanes 151, the water will experience a pressure drop due to the tortuous nature of the path 150. Thus, the pressure of the water being applied to the module 10 will be relatively lower once it reaches the sealing plane 120.

Thus, the combination of the water intrusion path 150 decreasing the pressure of the water along with the consistent contact of the sealing plane 120 provides for a leak-proof design that can withstand high pressure spray testing and water contact that the module 10 may undergo during testing and once installed on a vehicle. This leak-proof design is accomplished without the use of a gasket along this interface or the use of post-assembly sealing material such as silicone.

The above description of the connector 12 and housing 14 relates to sealing the module 10 along the interface between the connector 12 and housing 14. As described above, the module also includes a baseplate 16 to which the assembled connector 12 and housing 14 are connected.

Figure 8:
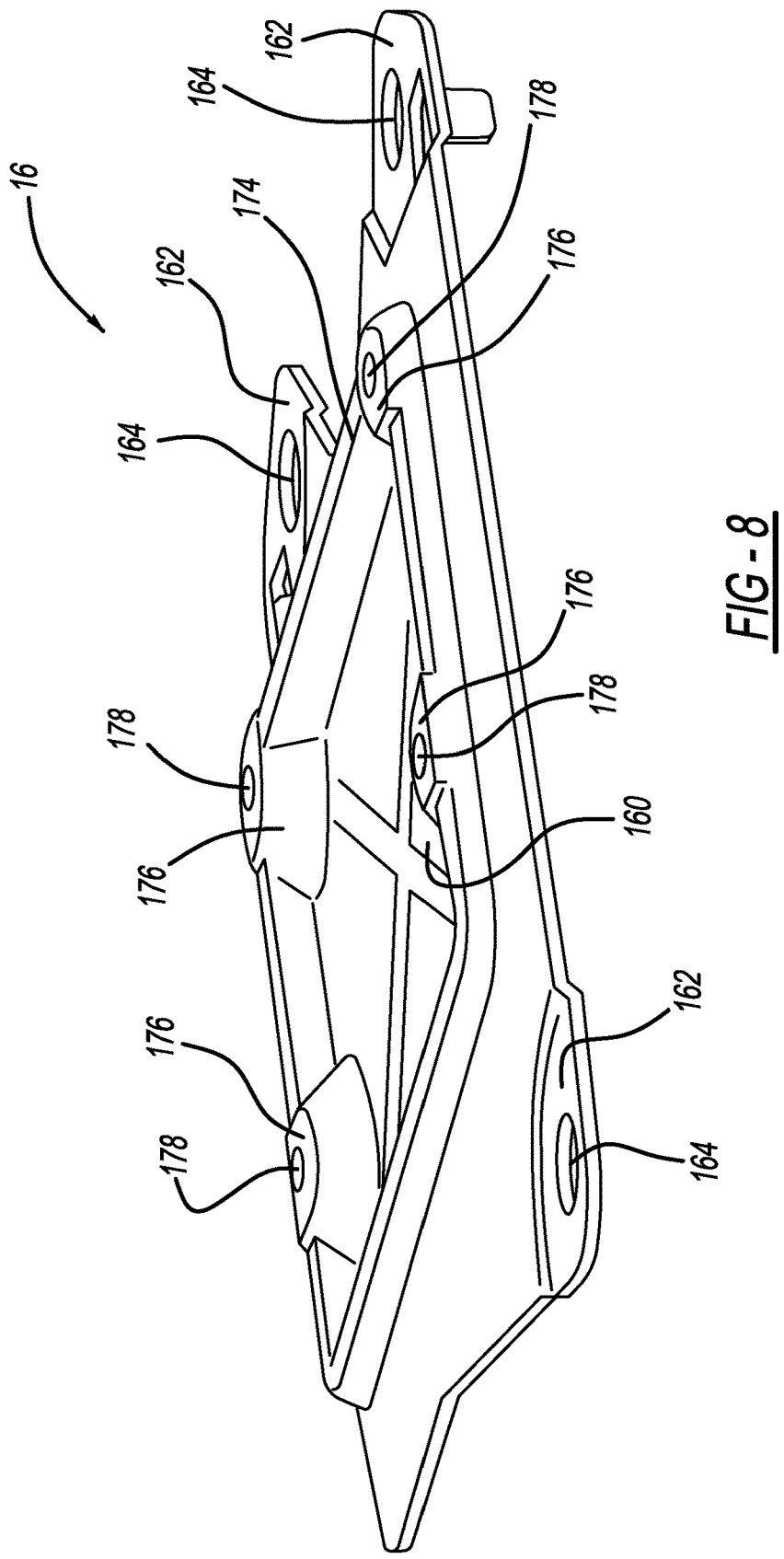
FIG. 8 is an isometric view of the baseplate including a mounting ring and raised mounting portions of the mounting ring.

With reference to FIG. 8, the baseplate 16 has a generally flat arrangement with a plurality of impressions and/or raised portions. The baseplate 16 can be made from various types of materials, such as aluminum or stainless steel, or an injection molded plastic material. The baseplate 16 is arranged such that its various features are integrally formed with the remainder of the baseplate 16.

The baseplate 16 is shaped to correspond to the bottom surfaces of the connector 12 and housing 14 that mate with the baseplate 16. The baseplate 16 includes a main body portion 160 having a plurality of mounting flanges 162 extending outwardly therefrom. The mounting flanges 162 include mounting holes 164 for mounting the baseplate 16 and module 10 to corresponding vehicle structure (not shown).

The baseplate 16 includes an outer sealing surface 170 having a generally rectangular shape with a continuous outer profile defining a closed loop. The sealing surface 170 provides a surface along which the bottom surfaces of the connector 12 and housing 14 can be disposed. The sealing surface 170 can be coplanar with outboard adjacent portions of the baseplate 16, or the sealing surface 170 can be raised relative to outboard portions of the baseplate. The sealing surface 170 extends along the baseplate 16 and includes a sufficient size and shape to accommodate the housing 14 and connector 12 when the housing 14 and connector 12 are mounted to the baseplate 16.

The baseplate 16 further includes a raised mounting ring 174 disposed inwardly from the outer mounting surface 170. The mounting ring 174 has a generally rectangular continuous profile defining a closed loop, similar to the sealing surface 170.

The mounting ring 174 includes a plurality of mounting portions 176 corresponding to the posts 60 of the housing 14. The mounting portions 176 define holes 178 therethrough for allowing a fastener to pass through the holes 178 and ultimately into the posts 60 of the housing 14 to secure the housing 14 and connector 12 to the baseplate 16. In one form, the mounting ring 174 includes four mounting portions 176 that correspond to four posts 60 of the connector.

In one approach, the mounting portions 176 are raised slightly relative to the mounting ring 174. In one form, the mounting portions are approximately 0.5 mm higher than the mounting ring 174. The mounting portions 176 are the portions where the PCB 17 that is housed within the housing 14 is mounted. Thus, with the PCB 17 mounted to the mounting portions 176, the PCB 17 will and mounting ring 174 will define a gap therebetween corresponding to the difference in height between the mounting portions 176 and the mounting ring 174.

Figure 9A:
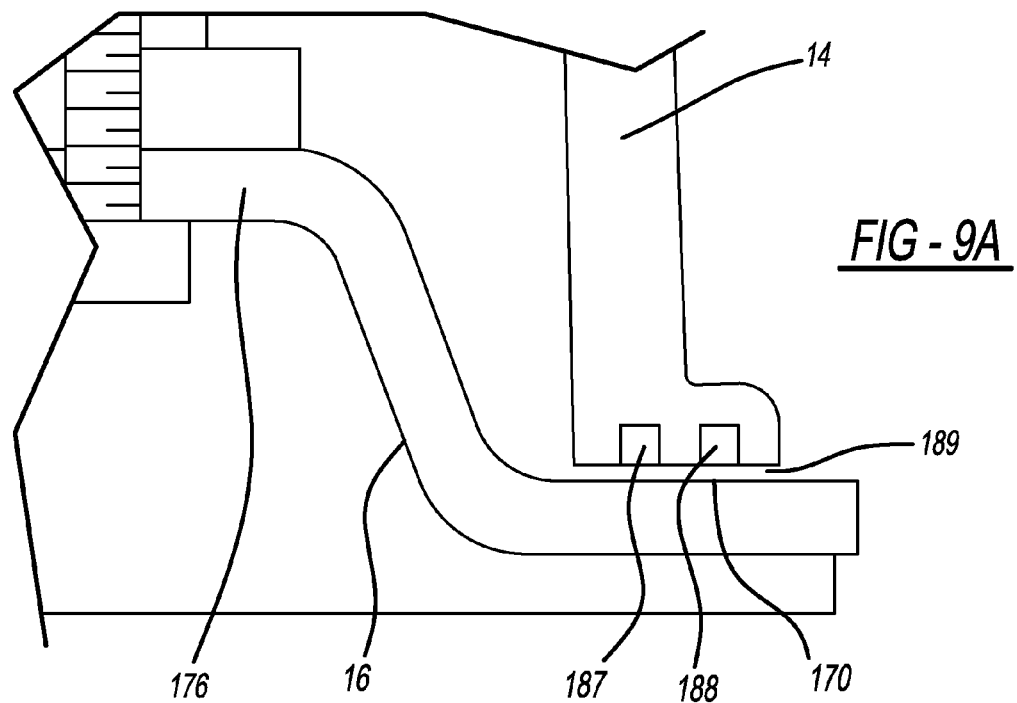
FIG. 9A is a cross-sectional view illustrating the housing and baseplate in an assembled state and recessed channels extending into the bottom surface of the housing at its interface with the baseplate and defining a gap between the bottom surface of the housing and the baseplate.
Figure 9B:
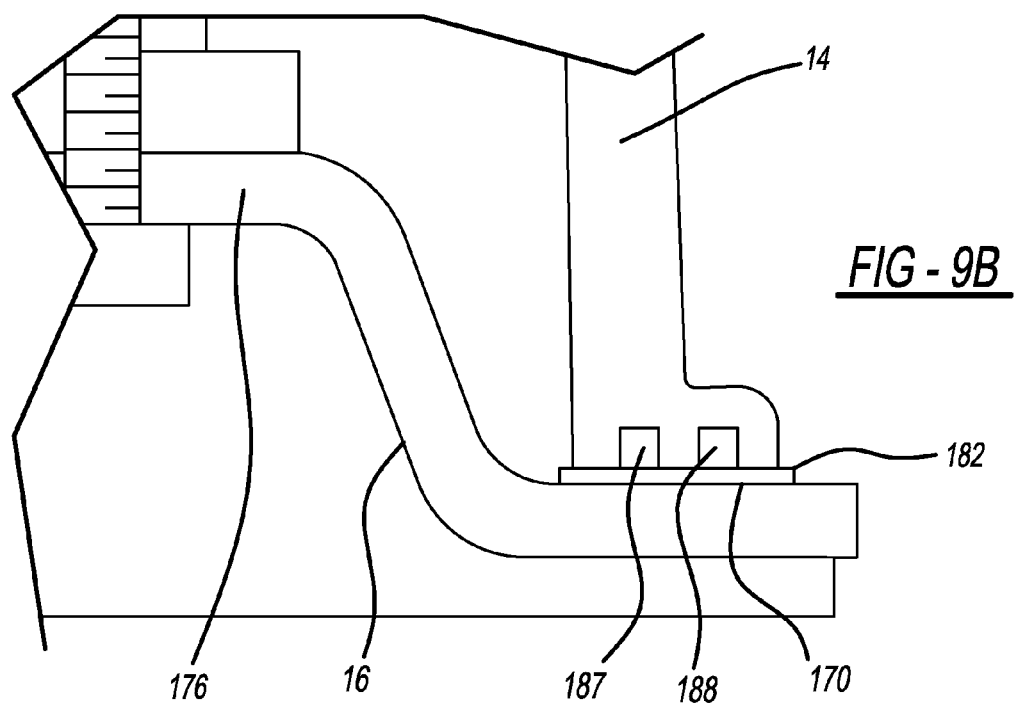
FIG. 9B is a cross-sectional view illustrating the housing and baseplate in an assembled state and recessed channels extending into the bottom surface of the housing at its interface with the baseplate and including a gasket disposed between the housing and the baseplate.

In one approach, the assembly of the housing 14, connector 12, and baseplate 16 can include a gasket 182 mounting over the sealing surface 170 (as shown in FIG. 9B). The gasket 182 can provide a seal that extends around the sealing surface 170 to seal the housing 14 and connector 12 against the baseplate 16. The gasket 182 can be made from various known gasket materials, such as dispensed or die cut foam, or the like.

When the connector 12 and housing 14 are installed on the baseplate 16, the contact between the connector 12 and housing 14 with the baseplate occurs along the gasket 182, thereby creating a seal around the perimeter of that interface.

When installed on the baseplate 16, the housing 14 and connector 12 apply a compressive force to the baseplate 16 and the gasket 182. However, the compressive force is typically limited by the fasteners used to make the connection. In one example, the compressive force is limited to 300 N.

The magnitude of the compressive force needed also depends on the surface area being compressed. A greater surface area would require a greater compressive force to achieve the same amount of compression. A smaller compressed surface area would require a smaller amount of force to achieve the same amount of compression.

As described above, and with reference to FIG. 9A-11, the connector 12 and housing 14 mate with the baseplate 16. A major bottom surface 184 of the connector 12 and a major bottom surface 186 of the housing 14 define the interface between the connector 12 and housing 14 and the base plate 16. However, instead of the full surface area of the bottom surfaces 184, 186 being compressed against the gasket 182, a reduced area is used.

The reduced area of compression applied against the gasket 182 is accomplished by the bottom surface 186 of the housing 14 having at least a first recessed channel 187 (an inner channel) and preferably a second recessed channel 188 (an outer channel). The two channels 187, 188 combine to define an inner bottom surface 186a, an intermediate bottom surface 186b, and an outer bottom surface 186c. If only one channel is used, then two bottom surfaces are defined.

The outer bottom surface 186c is outboard of the outer channel 188, which is outboard of the intermediate bottom surface 186b, which is outboard of the inner channel 187, which is outboard of the inner bottom surface 186a. The surface area of the bottom surfaces 186a, 186b, and 186c is smaller than the surface area of the bottom surface 186 if there were no recessed channels. Thus, use of the channels 187, 188 reduces the surface area for compression, creating an improved seal with the gasket 182.

With reference to FIG. 9A, the channels 187, 188 also provide benefits to the assembly in embodiments where no gasket is used. In this approach, with no gasket, a small gap 189 is defined between the housing 14 and the baseplate when assembled. This is due to the connection between the baseplate 16 and the housing 14 occurring via the fasteners at mounting portions 176. However, the gap can be approximately 0.5 mm after assembly. With the gap 189 this small, small amounts of water that may enter through the gap 189 will not typically make its way into the housing 14 of the PCB. The small amount of water is limited from entering the housing 14 due to the natural cohesive properties of water, as well as the gap 189 widening at the locations of the channels 187, 188. Instead, the water will pass into the channels 187, 188.

The existence of the gap 189 between the housing 14 and the baseplate 16 help isolate any vibrations that may occur that may be transferred from the housing 14 or the baseplate 16 and ultimately to the PCB. The PCB 17 can include sensors (not shown) which are used to detect various physical properties of the vehicle, such as crash, roll, acceleration, or the like. Thus reducing unwanted vibration in the PCB 17 can be beneficial. Accordingly, it may be desired to have the gap 189 rather than the gasket 182, with the channels 187, 188 being used to limit the introduction of water into the housing 14.

Similarly, the gap defined between the PCB 17 and the mounting ring 174 caused by the raised mounting portions 176 will isolate vibrations between the baseplate 16 and the PCB 17 and provide similar benefits.

Figure 11:
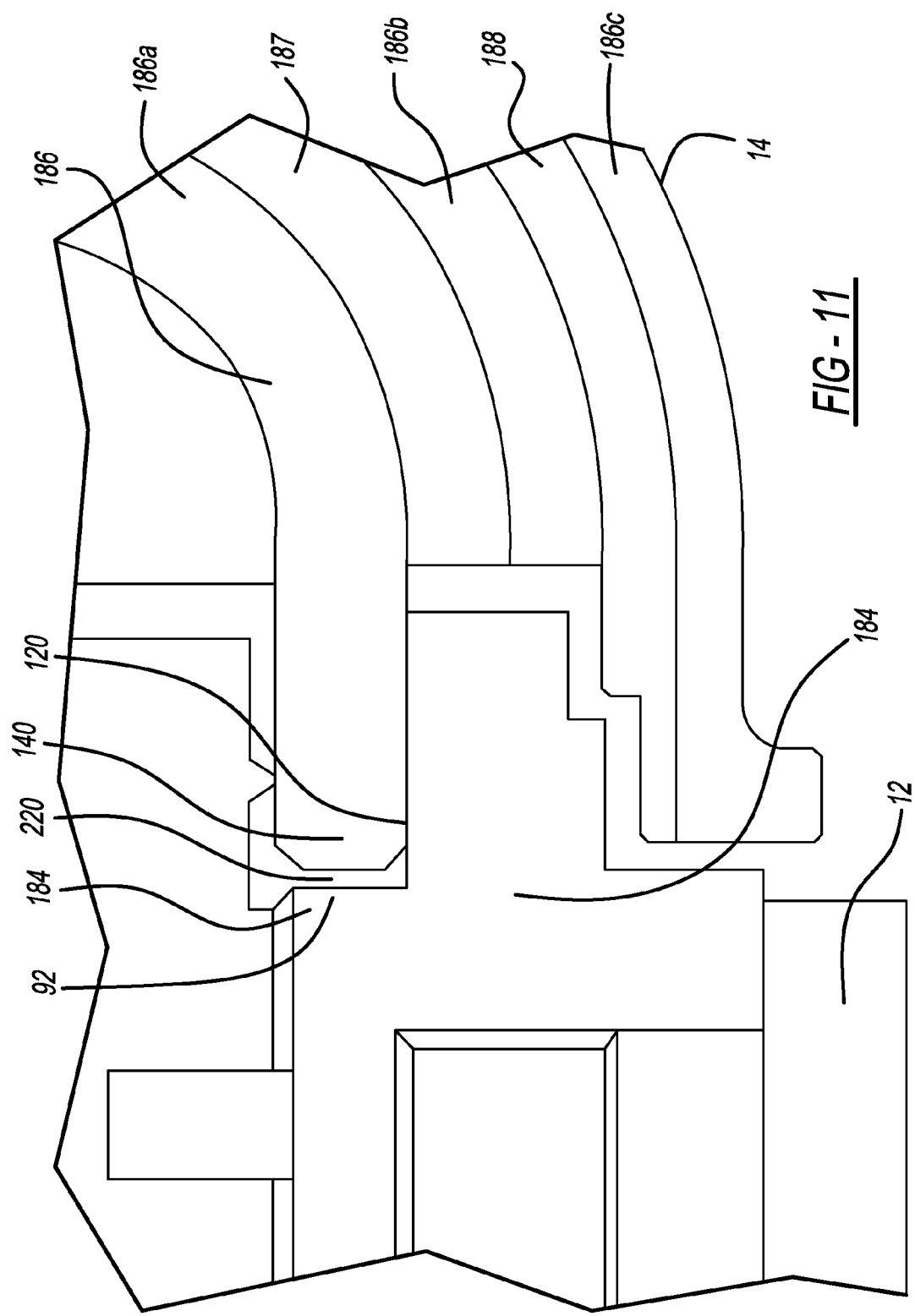
FIG. 11 is a partial bottom view of the connector and housing in an assembled state illustrating the channels and a continuous surface defined by the combination of an inner bottom surface of the housing and the bottom surface of the connector.

The bottom surfaces 186a, 186b, and 186c are typically coplanar with each other. Additionally, the bottom surfaces 186a, 186b, 186c are coplanar with the bottom surface 184 of the connector 12. When the connector 12 and housing 14 are assembled in this approach, the inner bottom surface 186a mates with the bottom surface 184 of the connector 12 at the location of the sealing plane 120 to define a continuous closed loop, as shown in FIG. 11.

Figure 10:
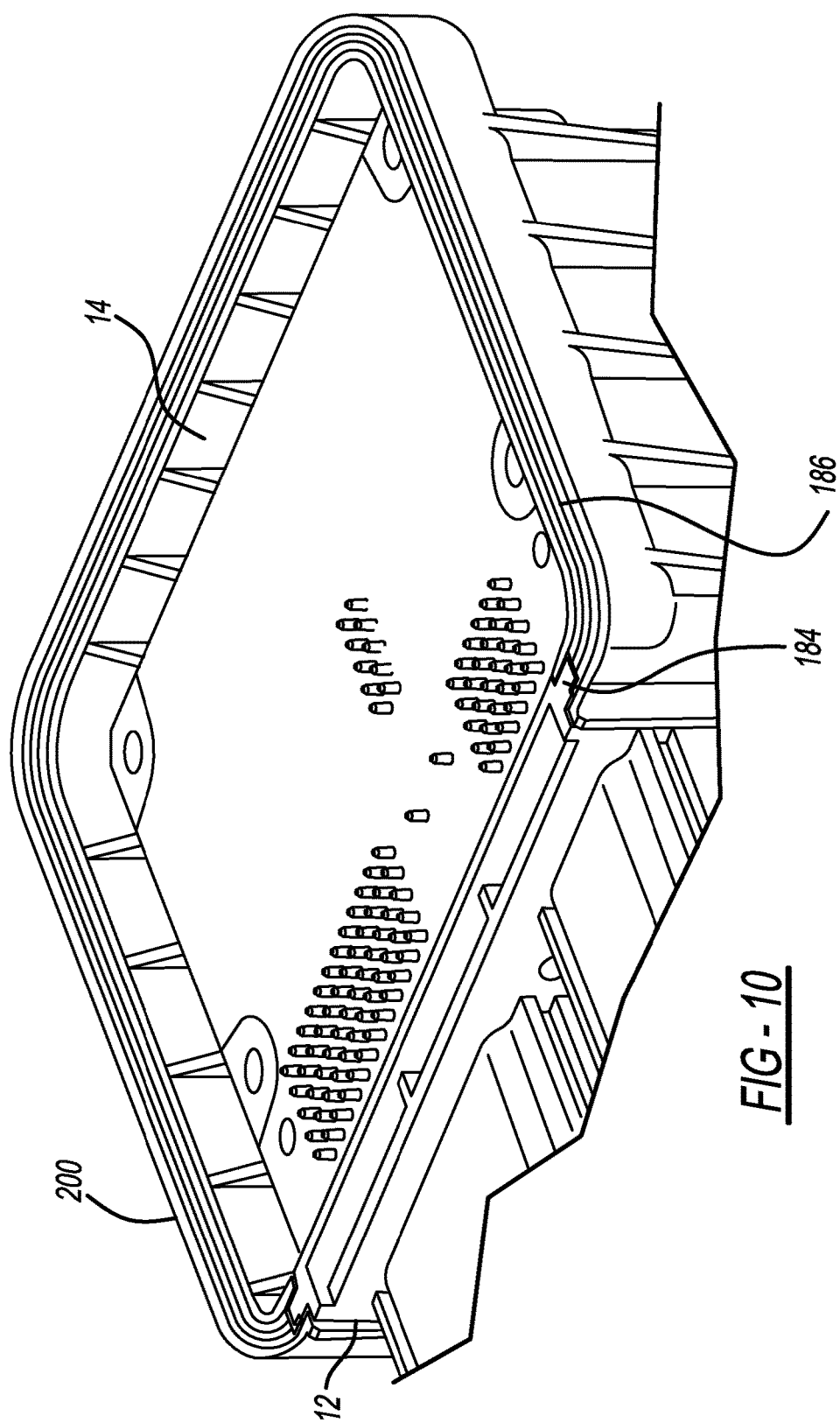
FIG. 10 is an isometric bottom view of the connector and housing in an assembled state and illustrating the channels extending around the outer perimeter of the housing.

The channels 187, 188 will generally extend completely around the bottom surface 186, from one end of the sealing plane 120 to the other end of the sealing plane 120, as shown in FIG. 10. The channels 187 and 188 are also in fluid communication with the bottom of the water intrusion path 150 and chicanes 151 (shown in FIG. 7). Water that enters the channels 187, 188 will therefore be directed around the bottom surface 186 of the housing 14 toward the water intrusion path 150 and the chicanes 151. Similarly, water entering the water intrusion path 150 and flowing past the chicanes 151 can enter the channels 187, 188 and be directed away from the connector 12.

Figure 12:
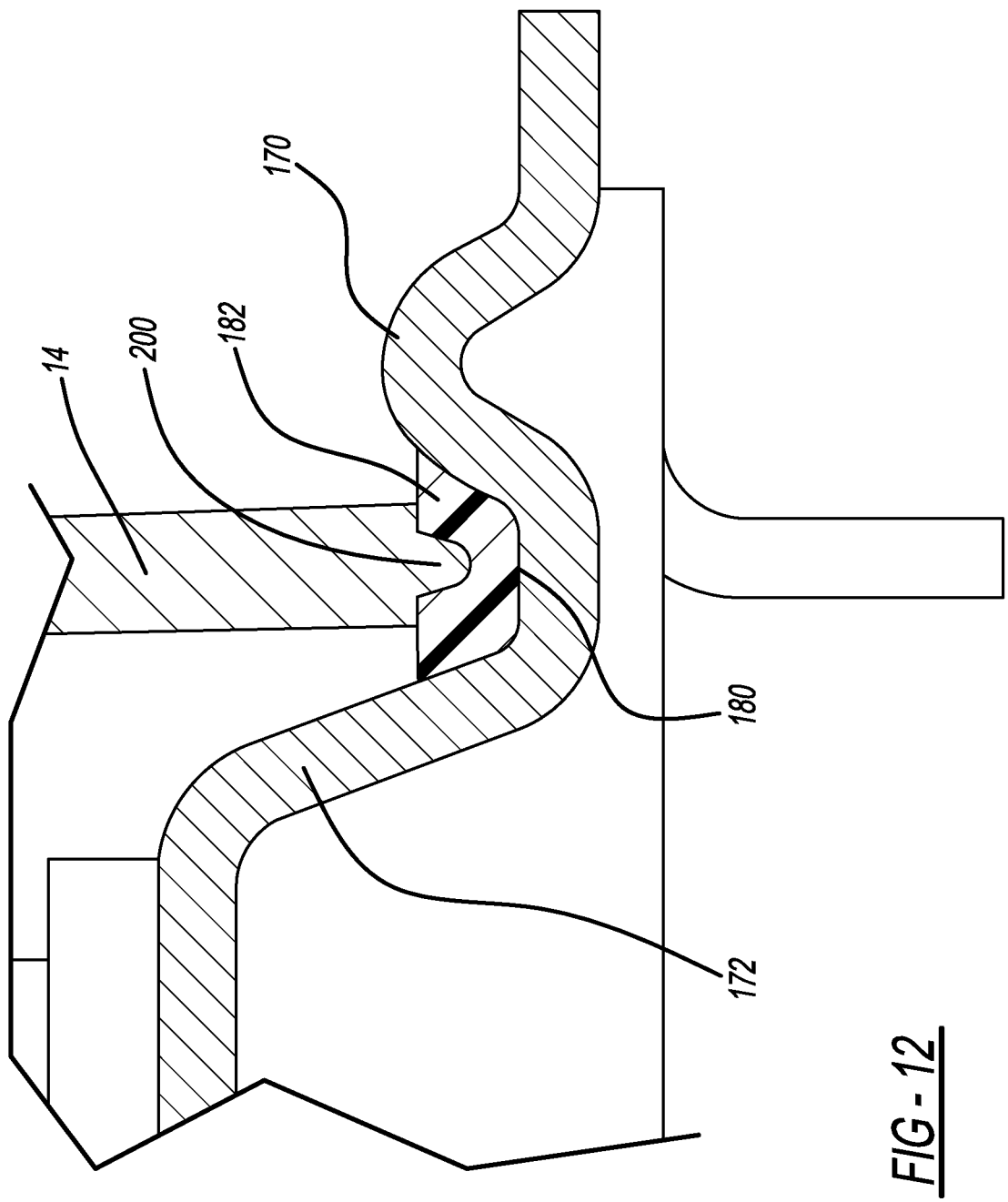
FIG. 12 is a cross-sectional view illustrating the housing and baseplate in an assembled state a peripheral bead extending from the bottom surface of the housing and being pressed into a gasket on the baseplate.
Figure 13:
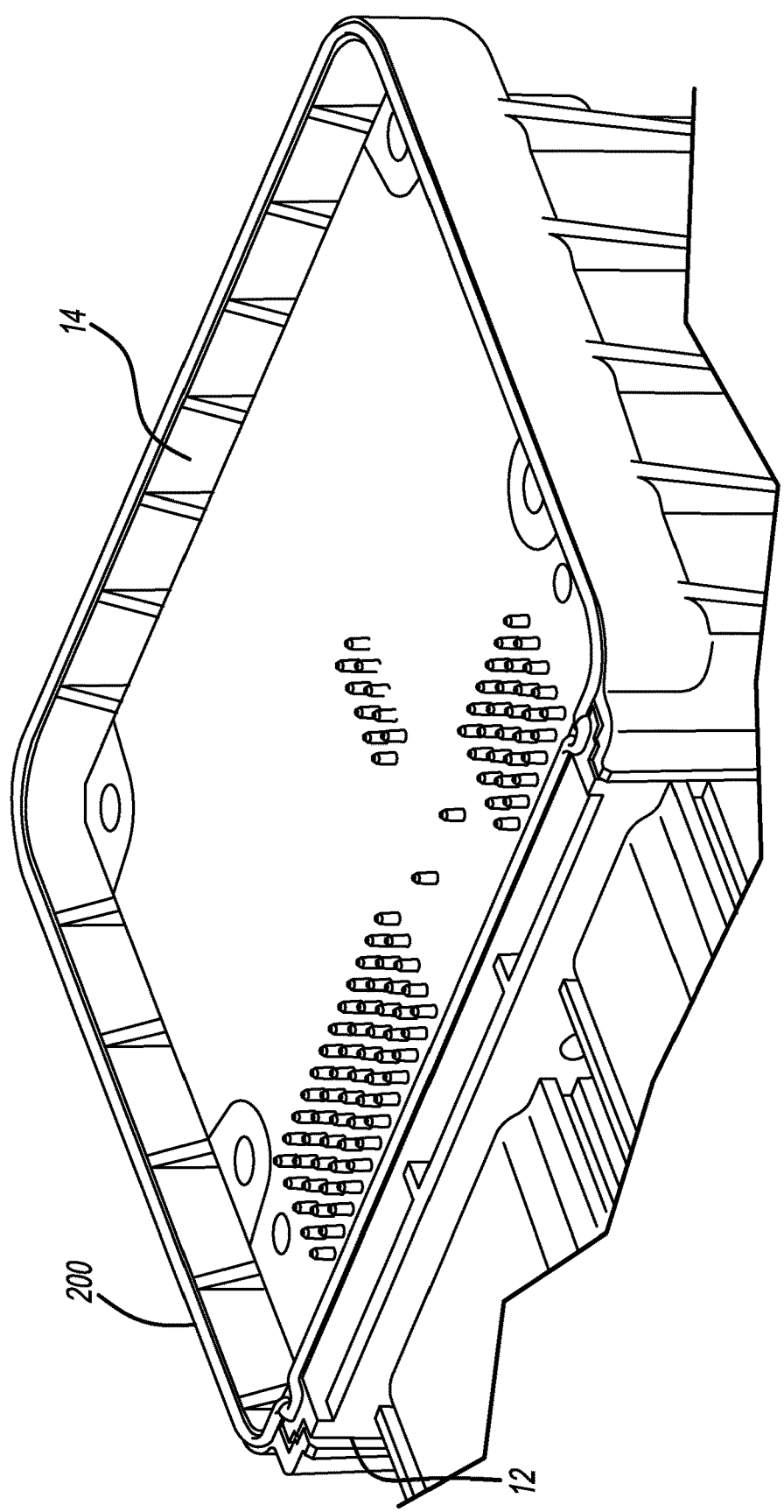
FIG. 13 is an isometric bottom view of the connector and housing in an assembled state and illustrating the peripheral bead extending around the outer perimeter of the housing and also along the connector.
Figure 14:
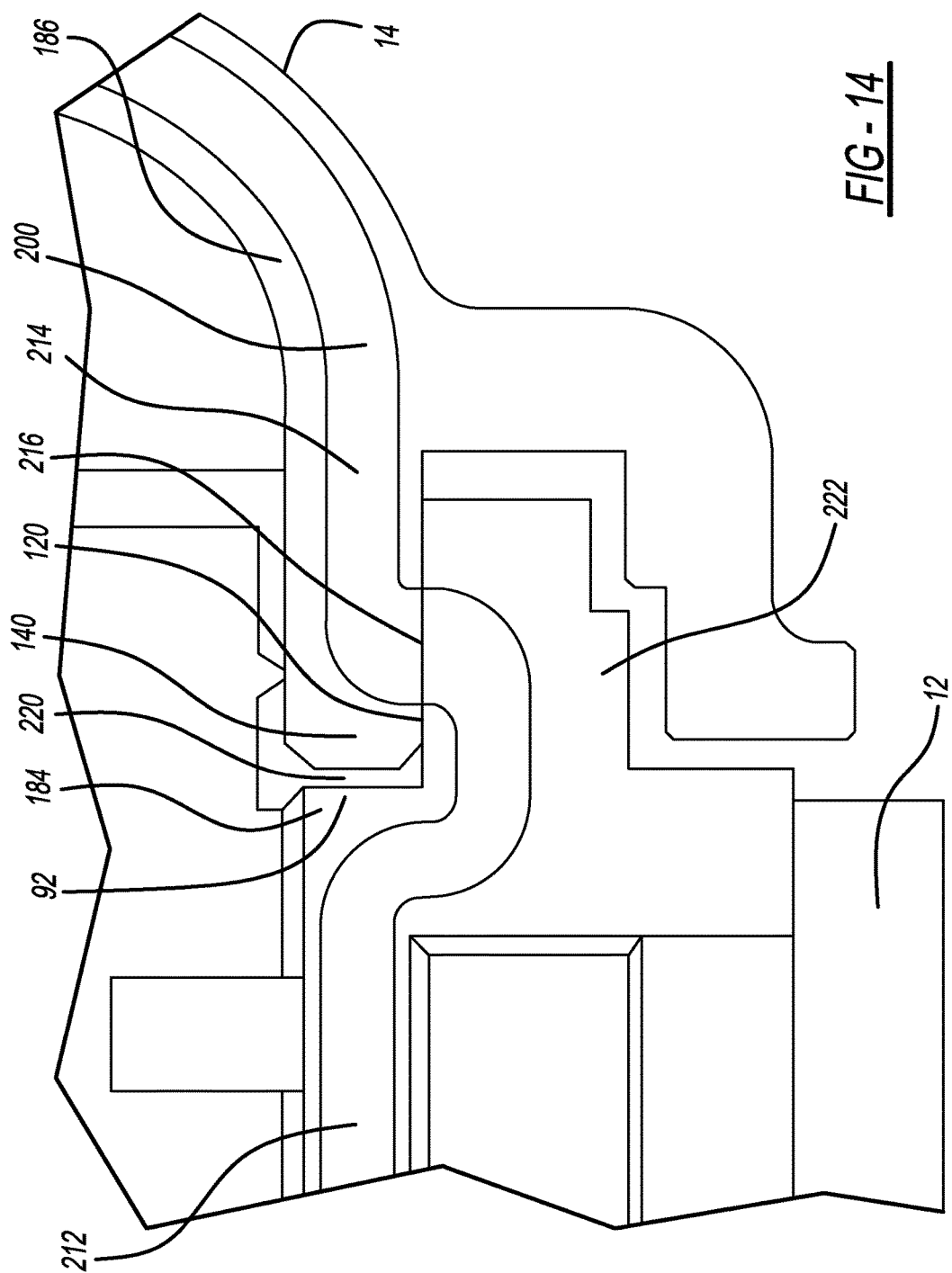
FIG. 14 is a partial bottom view of the connector and housing in an assembled state illustrating the peripheral bead extending along the bottom surface of the housing and the connector.

In an alternative approach, as shown in FIGS. 12-14, the connector 12 and housing 14 combine to define a peripheral bead 200. The peripheral bead 200 has a reduced bottom surface area relative to the major bottom surfaces 184, 186 of the connector 12 and 14. In one approach, the surface area is about ⅓ of the surface area of the bottom surfaces 184, 186 of the connector 12 and housing 14, and thereby allows for similar compression as an example with no peripheral bead but with about ⅓ the compressive force. Thus, either the compression force can be kept the same and the compression will increase, or the compressive force can be reduced and the same compression can be achieved. Or a higher compression can be achieved while still lowering the compressive force.

As shown in FIG. 12, the peripheral bead 200 extends downward from the bottom surfaces of the connector 12 and housing 14. More particularly, the peripheral bead 200 includes two portions: a connector portion 212 and a housing portion 214. The connector portion 212 and housing portion 214 combine to create a continuous closed loop when the connector 12 and housing 14 are connected. The connector portion 212 and housing portion 214 connect at the location of the sealing plane 120 at the bottom of the connector 12 and housing 14.

With reference to FIGS. 11 and 14, there is a gap 220 laterally between the inner protrusion 110 of the housing 14 and the recessed body portion 92 of the connector 12. This is due to the tolerances inherent in injection molded parts that allows for the connector 12 to be inserted into the housing 14. However, as described above, the inner protrusion 110 is forced against the outer flange 70 due to the crush ribs 102 of the connector 12 to create the sealing plane 120. Accordingly, there is no gap at the sealing plane 120.

In the embodiment including the sealing bead 200, shown in FIG. 14, the peripheral bead portions 212 and 214 can meet at the interface of the sealing plane 120 where there is no gap, such that the portions 212 and 214 can form a continuous bead. The bead portions 212 and 214 therefore meet at a bead interface 216. The bead interface 216 is present at both the front and rear sides of the module 10 at the bottom and at the locations of the sealing plane 120 interface between the inner protrusion 110 and the outer flange 70.

The peripheral bead 200 has a width that is generally consistent along its continuous closed loop except it is increased at the bead interface 216. The width is increased at this location to account for the lateral tolerances of the connector 12 relative to the housing 14. When installed, the connector 12 can be shifted slightly laterally relative to the housing 14 because there is not a lateral tight fit between the connector 12 and the housing 14. More particularly, there is the gap 220 defined laterally between inner protrusion 110 and the recessed body portion 92 of the connector 12. Thus, when installed, the connector 12 can be shifted to either the front or the rear relative to the housing 14. The amount that it may shift is limited by the gap 220, so the shifting is nominal. This nominal shifting is accounted for by increasing the width of the peripheral bead portions 212 and 214 at the bead interface 216. Accordingly, if the connector 12 is shifted relative to the housing 14, the width across the bead interface 216 will still be wide enough such that the peripheral bead 200 remains continuous around the bottom of the module 10.

The peripheral bead 200 also includes a U-turn portion 222 disposed at the bead interface 216 between the connector portion 212 and the housing portion 214. The U-turn portion 222 is defined by bends in both the connector portion 212 and the housing portion 214 of the peripheral bead 200. More particularly, the housing portion 214 extends into and along the bottom surface of the inner protrusion 110 toward the gap 220.

The housing portion 214 of the peripheral bead 200 then bends toward the adjacent outer flange 70 and toward the peripheral bead interface 216. The connector portion 212 of the peripheral bead 200 extends along the bottom surface of the recessed body portion 92 of the connector 12 and generally aligned with the inner protrusion 110. As the connector portion 212 of the bead 200 approaches the gap 220, the connector portion 212 bends away from the gap 220 and toward the inner flange 70. The connector portion 212 then bends again to extend generally parallel to the sealing plane 120 between the connector 12 and the housing 14. The connector portion 212 then bends again toward the bead interface 216, where the connector portion 212 meets the housing portion 214.

Thus, the peripheral bead 200 includes, in one approach, four bends that define the U-turn portion 222, such that the peripheral bead 200 extends across the sealing plane 120 between the housing 14 and connector 12 and also around the gap 220. The gap 220 is therefore disposed within the U-turn portion 222. In another approach, the U-turn portion 222 could be in the form of two bends rather than four, and can be described as an S-turn portion. In this approach, the bend in the housing portion 214 of the peripheral bead 200 is the same as described above, but the connector portion 212 extends straight across the bottom of the connector 12 generally aligned with the outer flange 70, and makes a single bend toward the bead interface 216.

Accordingly, the above described peripheral bead 200 provides a continuous closed loop for engaging the baseplate 16. Compression of the connector 12, housing 14, and the peripheral bead 200 on the bottom against the gasket 182 of the baseplate 16 provides a seal against water leakage around the bottom of the module 10.

Combined with the above described sealing plane 120 between the connector 12 and housing 14, the sealing with the baseplate 16 provides a robust seal for the module 10 that resists leakage that that may occur during spray testing or exposure to liquid in the field once installed.

The embodiment of FIGS. 12-14 illustrating the sealing bead 200 is shown in use with the housing 14 that does not include the channels 187 and 188. However, it will be appreciated that the sealing bead 200 could be used with the channels 187, 188, with the bead 200 being disposed along the inner bottom surface 186a. In FIG. 12, the gasket 182 is shown as being disposed within a groove or track 180 defined by a raised rim 170 of the baseplate 16 and without the channels 187 and 188 of the housing 14. However, it will be appreciated that the sealing bead can be used with the gasket 182 being disposed on a generally flat surface without the use of a groove or track, similar to the embodiment shown in FIG. 9A.

The sealing capabilities and other aspects for limiting water intrusion of the module 10 described above are accomplished without the need for post assembly application of silicone or other sealing materials along the exposed mating areas between the connector 12, housing 14, and baseplate 16, allowing for a faster and more inexpensive assembly.

While the above description constitutes the preferred embodiment of the present invention, it will be appreciated that the invention is susceptible to modification, variation and change without departing from the proper scope and fair meaning of the accompanying claims.

The invention claimed is:

1. An electronics module comprising:
   a baseplate having an upper surface and a lower surface and a mounting ring extending upwardly from the upper surface;
   a housing coupled to the mounting ring of the baseplate, the housing defining a bottom surface and a bottom opening and a side opening;
   a connector attached to the housing at the side opening of the housing, the connector defining a bottom portion and an upper mating portion, wherein the upper mating portion couples with the housing along the side opening;
   wherein the bottom surface of the housing and the bottom surface of the connector face the upper surface of the baseplate;
   wherein the housing defines an inner protrusion having an outer surface extending upwardly from the bottom surface of the housing, wherein the outer surface defines a housing plane facing a first direction toward the connector;
   wherein the connector defines an outer flange having an inner surface extending upwardly from the bottom surface of the connector, wherein the inner surface defines a connector plane facing a second direction toward the housing, wherein the second direction is opposite the first direction;
   wherein the inner surface of the outer flange and the outer surface of the inner protrusion are in direct contact substantially around a perimeter of the inner protrusion and the outer flange to define a sealing plane that extends to bottom surfaces of the inner protrusion and outer flange, wherein the sealing plane is defined by direct contact of the housing plane and the connector plane such that the housing plane and connector plane touch each other and a sealing connection is defined by the direct contact between the housing plane and the connector plane;
   wherein the connector includes an upper mating portion and the housing includes a mating portion, wherein an inner surface of the upper mating portion of the connector and an outer surface of the mating portion of the housing directly contact each other around the entire perimeter to define the sealing plane; and
   wherein the upper mating portion of the housing and the mating portion of the connector define a flow path between an outer surface of the upper mating portion of the connector and an inner surface of the mating portion of the housing defining a plurality of chicanes to reduce the pressure of water or other liquid that enters the flow path, wherein the plurality of chicanes are disposed outwardly from the sealing plane such that water will flow through the flow path and the chicanes before reaching the sealing plane.

2. The module of claim 1, wherein the bottom surface of the housing defines at least one recessed channel extending into the bottom surface of the housing and defining at least an inner portion of the bottom surface of the housing and an outer portion of the bottom surface of the housing.

3. The module of claim 2, wherein the at least one recessed channel comprises an inner channel and an outer channel defining an intermediate bottom surface therebetween, with the outer bottom surface being outboard of the outer channel and the inner bottom surface being inboard of the inner channel.

4. The module of claim 2, wherein the bottom surface of the housing and the upper surface of the baseplate define a gap therebetween.

5. The module of claim 1, wherein the bottom surfaces of the housing and connector are co-planar.

6. The module of claim 2, wherein the at least one channel and the inner portion of the bottom surface of the housing and the outer portion of the bottom surface of the housing extend along the bottom surface of the housing from one side of the sealing plane to an opposite side of the sealing plane.

7. The module of claim 2, wherein the inner bottom surface mates with the bottom surface of the connector and combine to define a continuous closed loop.

8. The module of claim 3, wherein the inner bottom surface, outer bottom surface, and intermediate bottom surface of the housing are coplanar with the bottom surface of the connector.

9. The module of claim 1, wherein the connector includes a plurality of crush ribs.

10. The module of claim 9, wherein the crush ribs extend generally vertically along an outer surface of an inner flange, wherein the crush ribs directly contact an inner surface of the inner protrusion of the housing and apply a compressive force on the inner protrusion of the housing such that the housing plane of the housing is pressed against the connector plane of the connector to create the direct contact between the inner surface of the outer flange of the connector and the outer surface of the inner protrusion of the housing.

11. The module of claim 1, wherein the inner protrusion of the housing is disposed between an outer flange and an inner flange of the connector.

12. The module of claim 1, wherein the outer flange of the connector includes a stepped portion extend outwardly therefrom.

13. The module of claim 5, wherein the bottom surface of the housing and the bottom surface of the connector are generally co-planar in the area of the sealing plane.

14. The module of claim 1, wherein the chicanes comprise at least a first, second, third, and fourth chicane, the first chicane defined by a space between a first outer corner of the housing and a first inner corner of the connector, the second chicane defined by a first outer corner of the connector and a first inner corner of the housing, the third chicane defined by a second outer corner of the housing and a second inner corner of the connector, and the fourth chicane is defined by a second inner corner of the housing and a second outer corner of the connector.

* * * * *